(12) United States Patent
Terashima et al.

(10) Patent No.: US 9,755,111 B2
(45) Date of Patent: Sep. 5, 2017

(54) ACTIVE REGION CONTAINING NANODOTS (ALSO REFERRED TO AS "QUANTUM DOTS") IN MOTHER CRYSTAL FORMED OF ZINC BLENDE-TYPE (ALSO REFERRED TO AS "CUBIC CRYSTAL-TYPE") ALYINXGAL-Y-XN CRYSTAL (Y[[□]][≥] 0, X > 0) GROWN ON SI SUBSTRATE, AND LIGHT EMITTING DEVICE USING THE SAME (LED AND LD)

(71) Applicants: NITTO OPTICAL CO., LTD., Tokyo (JP); SOLARTES Lab., LTD., Kanagawa (JP); Yoko Terashima, Kanagawa (JP)

(72) Inventors: Kazutaka Terashima, Kanagawa (JP); Suzuka Nishimura, Kanagawa (JP); Muneyuki Hirai, Kanagawa (JP)

(73) Assignees: NITTO OPTICAL CO., LTD., Tokyo (JP); SOLARTES Lab, LTD., Kanagawa (JP)

( * ) Notice: Subject to any disclaimer, the term of this patent is extended or adjusted under 35 U.S.C. 154(b) by 0 days.

(21) Appl. No.: 14/959,420

(22) Filed: Dec. 4, 2015

(65) Prior Publication Data
US 2016/0087153 A1    Mar. 24, 2016

Related U.S. Application Data

(63) Continuation of application No. PCT/JP2014/064448, filed on May 30, 2014.

(30) Foreign Application Priority Data

Jun. 5, 2013    (JP) .................................. 2013-118851

(51) Int. Cl.
*H01L 33/32*    (2010.01)
*H01S 5/34*    (2006.01)
(Continued)

(52) U.S. Cl.
CPC .............. *H01L 33/32* (2013.01); *H01L 33/06* (2013.01); *H01L 33/12* (2013.01); *H01S 5/021* (2013.01);
(Continued)

(58) Field of Classification Search
CPC ....... H01L 33/007; H01L 33/06; H01L 33/32; H01S 5/021; H01S 5/3412; H01S 5/34333
(Continued)

(56) References Cited

U.S. PATENT DOCUMENTS 5,042,043 A       8/1991   Hatano et al.
2003/0027099 A1 *  2/2003  Udagawa ............... H01L 33/06
                                                 433/79

(Continued)

FOREIGN PATENT DOCUMENTS

CN    103187498 A    7/2013
JP    H102288388 A    11/1990
(Continued)

OTHER PUBLICATIONS

WIPO; International Search Report for corresponding PCT/JP2014/064448 dated Aug. 26, 2014, 2 pages.
(Continued)

*Primary Examiner* — Yuanda Zhang
*Assistant Examiner* — Michael Carter
(74) *Attorney, Agent, or Firm* — Maier & Maier, PLLC (57) ABSTRACT

A structure of a high luminance LED and a high luminance LD is provided. The present invention provides a light emitting device containing, on a zinc blend-type BP layer formed on an Si substrate, an $Al_yIn_xGa_zN$ (y≥0, x>0) crystal as a mother crystal maintaining the zinc blend-type crystal
(Continued)

structure and In dots having an In concentration higher than that of the $Al_yIn_xGa_zN$ (y≥0, x>0) crystal as the mother crystal.

9 Claims, 5 Drawing Sheets

(51) Int. Cl.
    *H01S 5/343* (2006.01)
    *H01L 33/06* (2010.01)
    *H01S 5/02* (2006.01)
    *H01L 33/12* (2010.01)
    *H01L 33/00* (2010.01)

(52) U.S. Cl.
    CPC ........ *H01S 5/3412* (2013.01); *H01S 5/34333* (2013.01); *H01L 33/007* (2013.01); *H01S 2301/173* (2013.01); *H01S 2304/04* (2013.01)

(58) Field of Classification Search
    IPC ................................ H01L 33/007,33/06, 33/32
    See application file for complete search history.

(56) References Cited

U.S. PATENT DOCUMENTS

| | | |
|---|---|---|
| 2003/0047795 A1 | 3/2003 | Udagawa |
| 2003/0059971 A1* | 3/2003 | Chua ................ B82Y 20/00 438/46 |
| 2005/0087746 A1 | 4/2005 | Kryliouk et al. |
| 2006/0226416 A1 | 10/2006 | Lee et al. |
| 2008/0224268 A1 | 9/2008 | Abe et al. |
| 2009/0302308 A1 | 12/2009 | Chua et al. |
| 2009/0321781 A1 | 12/2009 | Broadley et al. |
| 2010/0311229 A1 | 12/2010 | Einav |
| 2011/0079767 A1 | 4/2011 | Senes et al. |

FOREIGN PATENT DOCUMENTS

| | | |
|---|---|---|
| JP | 2000012961 A | 1/2000 |
| JP | 2000349335 A | 12/2000 |
| JP | 2008258561 A | 10/2008 |
| JP | 2009010168 A | 1/2009 |
| JP | 2010010678 A | 1/2010 |
| JP | 2010245491 A | 10/2010 |
| JP | 2011003803 A | 1/2011 |
| JP | 2011503893 A | 1/2011 |
| JP | 2011044539 A | 3/2011 |
| JP | 2011523206 A | 8/2011 |

OTHER PUBLICATIONS

Vurgaftman and J. R. Meyer, "Band parameters for nitrogen-containing semiconductors", Journal of Applied Physics 94, 3675 (2003), 23 pgs.

N. N. Ledentsov and D. Bimberg, "Growth of self-organized quantum dots for optoelectronics applications: nanostructures, nanoepitaxy, defect engineering", Journal of Crystal Growth, 255 (2003) 68-80, 13 pgs.

P. Rinke, et al., "Band Gap and band parameters of InN and GaN from quasiparticle energy calculations based on exact-exchange density-functional theory", Applied Physics Letters 89, 161919 (2006), 4 pgs.

Christian Tessarek et al., "Improved capping layer growth towards increased stability of InGaN quantum dots", Phys. Status Solidi C6, No. S2, S561-S564 (2009) / DOI 10.1002/pssc.200880913, 4 pgs.

Ho and G. B. Stringfellow, Appl. Phys. Lett. 69, 2701 (1996), 4 pgs.

German Office Action dated Oct. 19, 2016, in connection with corresponding DE Application No. 11 2014 002 691.3 (11 pgs., including English translation).

* cited by examiner

GROWTH PRESSURE 500mbar

| GROWTH TEMPERATURE (°C) | DENSITY (number/μm²) | DOT SIZE (nm) | In(110) (c/s) | C-GaN(002) (c/s) | C-GaN/In ratio |
|---|---|---|---|---|---|
| 500 | 1.04 | 38 | 4420 | 101937 | 23.06 |
| 600 | 4.25 | 23.2 | 3507 | 70941 | 20.23 |
| 700 | 0.5 | 45~50 | 5098 | 129841 | 25.47 |
| 800 | 0.2 | IMMEASURABLE | 5805 | 119860 | 20.65 |

Fig. 3

GROWTH PRESSURE 800mbar

| GROWTH TEMPERATURE (°C) | DENSITY (number/μm²) | DOT SIZE (nm) | In(110) (c/s) | C-GaN(002) (c/s) | C-GaN/In ratio |
|---|---|---|---|---|---|
| 550 | 3.35 | 14.4 | 2471 | 96909 | 39.22 |
| 600 | 3.75 | 15.2 | 2495 | 98878 | 39.63 |
| 650 | 1.06 | 45~50 | 3604 | 59142 | 16.41 |
| 700 | 0.44 | IMMEASURABLE | 1573 | 1946 | 1.24 |

ACTIVE REGION CONTAINING NANODOTS (ALSO REFERRED TO AS "QUANTUM DOTS") IN MOTHER CRYSTAL FORMED OF ZINC BLENDE-TYPE (ALSO REFERRED TO AS "CUBIC CRYSTAL-TYPE") ALYINXGAL-Y-XN CRYSTAL (Y[[☐]][≥] 0, X > 0) GROWN ON SI SUBSTRATE, AND LIGHT EMITTING DEVICE USING THE SAME (LED AND LD)

CROSS REFERENCE TO RELATED APPLICATION

This application is based upon and claims the benefit of priority from the prior Japanese Patent Application No. 2013-118851, filed on Jun. 5, 2013 and PCT Application No. PCT/JP2014/064448, filed on May 30, 2014, the entire contents of which are incorporated herein by reference.

FIELD

The present invention relates to an active region containing nanodots (also referred to as "quantum dots") in a mother crystal formed of a zinc blende-type $Al_yIn_xGa_{1-y-x}N$ crystal (y≥0, x>0) grown on an Si substrate, and a light emitting device using the same (LED and LD).

BACKGROUND

A GaN-based crystal is known as being used for a short-wavelength light emitting device. Usually, the GaN-based crystal is formed by epitaxial growth on a sapphire substrate with a buffer layer being provided therebetween. If the GaN-based crystal is epitaxially grown directly on the Si substrate, a composite device including a light emitting device and a semiconductor integrated circuit may be produced.

A GaN-based crystal is available in two types. One type of GaN-based crystal has a wurtzite crystal structure having a superb piezoelectric characteristic, and the other type of GaN-based crystal has a zinc blende-type crystal structure which almost does not have any piezoelectric characteristic but has a high light emission characteristic, a high information transmission characteristic and a high information processing function. The differences in the crystal structure and the changes in the characteristics that are currently known are described in patent literature 1 (Patent Literature 1: Journal of Applied Physics (3675) Vol. 94, No. 6. I. Vurgaftman and J. R. Meyer; Band parameters for nitrogen-containing semiconductors) described later.

In general, a wurtzite crystal structure is a stable crystal structure. Meanwhile, a zinc blende-type crystal, which is metastable, promotes a superb carrier recombination and thus has a significantly high light emission efficiency. Therefore, the zinc blende-type crystal is strongly desired as a material of a light emitting element. The zinc blende-type crystal has the same structure as that of a GaAs crystal and an Si crystal.

Nanodots are reported in many papers as shown in patent literature 2 through patent literature 4 (Patent Literature 2: Journal of Crystal Growth, 255 (2003) 68-80 N. N. Ledentsov and D. Bimberg, "Growth of self-organized quantum dots for Optoelectronics applications: nanostructures, nanoepitaxy, defect engineering", Patent Literature 3: Applied Physics letters 89, 161919 (2006) P. Rinke, et al., "Band Gap and band parameters of InN and GaN from quasiparticle energy calculations based on exact-exchange density-functional theory", Patent Literature 4: Physica Status Solidi C6, No 52, S561-S564 (2009)/D0110.1002/pssc. 2008801913; Christian Tessarek et al., "Improved capping layer growth towards increased stability of InGaN quantum dots").

In the case where Ga and In are grown in a miscible state, whether Ga and In are mixed in a crystalline state or not depends on the concentration ratio between Ga and In. Herein, a region in which Ga and In are not mixed together in a crystalline state is referred to as an "immiscibility gap". Especially in the case where the crystal is grown at a low temperature or there is a large distortion remaining in the crystal substrate, there is a conspicuous tendency that whether an immiscibility gap is formed or not depends on the concentration ratio between Ga and In. Regarding the growth of Ga and In in a miscible state, all of the above-mentioned prior documents describes that gas is supplied in the immiscibility gap.

In a region having a growth temperature of 700° C. or lower and having an In concentration of 90% or higher, a uniform crystalline region containing the In element at a high content is grown. In this region, a quantum well (QW structure) may be formed as an active layer. However, the experimental results described in many documents are all regarding the wurtzite crystal. There is no experimental results on the cubic crystal (zinc blende-type crystal). Currently, no cubic crystal which may be technologically evaluated is available (Refer to Patent Literature 5: I. Ho and G. B. Stringfellow, Appl. Phys. Lett. 69, 2701 (1996), Patent Literature 6: PCT Japanese National-Phase Laid-Open Patent Publication No. 2011-523206, Patent Literature 7: Japanese Laid-Open Patent Publication No. 2011-3803, Patent Literature 8: Japanese Laid-Open Patent Publication No. 2011-44539, Patent Literature 9: Japanese Laid-Open Patent Publication No. 2010-245491)

SUMMARY

The present invention has an object of forming a zinc blende-type GaN-based crystal via a BP crystal, which is an intermediate crystal, on an Si substrate to provide a structure of a high luminance LED and a high luminance LD.

Especially, the present invention has an object of providing a high luminance light emitting device including a crystal of the zinc blende-type structure, which is difficult to be grown, as a mother crystal and having a nanodot structure that has a high concentration of In atoms having a small bandgap.

An embodiment according to the present invention provides a light emitting device containing, on a zinc blende-type BP layer formed on an Si substrate, an $Al_yIn_xGa_zN$ crystal (y≥0, x>0) as a mother crystal maintaining the zinc blende-type crystal structure and In dots having an In concentration higher than that of the $Al_yIn_xGa_{1-y-x}N$ crystal (y≥0, x>0) as the mother crystal.

It is desirable that the value of x in the $Al_yIn_xGa_{1-y-x}N$ (y≥0, x>0) nanodots is in the range of 0.15 or greater and 0.9 or less.

It is desirable that the $Al_yIn_xGa_{1-y-x}N$ (y≥0, x>0) nanodots have a diameter of 100 nm or shorter.

It is desirable that the $Al_yIn_xGa_{1-y-x}N$ (y≥0, x>0) nanodots have a density of $10^3/cm^2$ or higher and $10^4/cm^2$ or lower.

In an embodiment according to the present invention, it is desirable that a light emitting device according to the present invention includes an Si crystal substrate obtained as a result of being inclined at an angle in the range of 5 degrees or greater and 10 degrees or less from a (100) plane toward a (110) plane; a buffer layer formed on the crystal substrate, the buffer layer containing a BP crystal; an n-type GaN-based crystal formed on the buffer layer containing the BP crystal; and an active region containing a zinc blende-type $Al_yIn_xGa_{1-y-x}N$ (y≥0, x>0) mother crystal formed on the n-type GaN-based crystal, and $Al_yIn_xGa_{1-y-x}N$ (y≥0, x>0) nanodots formed in the zinc blende-type $Al_yIn_xGa_{1-y-x}N$ (y≥0, x>0) mother crystal, the $Al_yIn_xGa_{1-y-x}N$ (y≥0, x>0) nanodots having an In concentration higher than that of the zinc blende-type $Al_yIn_xGa_{1-y-x}N$ (y≥0, x>0) mother crystal.

It is desirable that the n-type GaN-based crystal contains silicon incorporated thereto as an impurity.

It is desirable that the silicon is contained in the n-type GaN-based crystal at a concentration of $5\times10^{18}/cm^{-3}$ or higher and $5\times10^{20}/cm^{-3}$ or lower.

In another embodiment according to the present invention, it is desirable that a light emitting device according to the present invention includes an Si crystal substrate obtained as a result of being inclined at an angle in the range of 5 degrees or greater and 10 degrees or less from a (100) plane toward a (110) plane and being inclined at an angle in the range of 5 degrees or greater and 10 degrees or less from the (100) plane toward a (111) plane; a buffer layer formed on the crystal substrate, the buffer layer containing a BP crystal; an n-type GaN-based crystal formed on the buffer layer containing the BP crystal; and an active region containing a zinc blende-type $Al_yIn_xGa_{1-y-x}N$ (y≥0, x>0) mother crystal formed on the n-type GaN-based crystal, and $Al_yIn_xGa_{1-y-x}N$ (y≥0, x>0) nanodots formed in the zinc blende-type $Al_yIn_xGa_{1-y-x}N$ (y≥0, x>0) mother crystal, the $Al_yIn_xGa_{1-y-x}N$ (y≥0, x>0) nanodots having an In concentration higher than that of the zinc blende-type $Al_yIn_xGa_{1-y-x}N$ (y≥0, x>0) mother crystal.

In still another embodiment according to the present invention, it is desirable that a light emitting device according to the present invention includes an Si substrate; a buffer layer formed on the Si substrate, the buffer layer containing a BP crystal; an n-type GaN-based crystal formed on the buffer layer containing the BP crystal; and an active region containing a zinc blende-type $Al_yIn_xGa_{1-y-x}N$ (y≥0, x>0) mother crystal formed on an $Al_yGa_{1-y}N$ crystal having a zinc blende-type structure that is formed on the n-type GaN-based crystal, and $Al_yIn_xGa_{1-y-x}N$ (y≥0, x>0) nanodots formed in the zinc blende-type $Al_yIn_xGa_{1-y-x}N$ (y≥0, x>0) mother crystal, the $Al_yIn_xGa_{1-y-x}N$ (y≥0, x>0) nanodots having an In concentration higher than that of the zinc blende-type $Al_yIn_xGa_{1-y-x}N$ (y≥0, x>0) mother crystal; wherein the active region has a surface flattened by amorphous-like $In_xGa_{1-x}N$ having incomplete crystallinity formed in a gap among the $Al_yIn_xGa_{1-y-x}N$ (y≥0, x>0) nanodots so as to fill the gap.

It is desirable that the amorphous-like $In_xGa_{1-x}N$ having incomplete crystallinity has an In concentration lower than that of the $Al_yIn_xGa_{1-y-x}N$ (y≥0, x>0) nanodots.

In still another embodiment according to the present invention, it is desirable that a semiconductor laser according to the present invention includes an Si substrate; a buffer layer formed on the Si substrate, the buffer layer containing a BP crystal; an n-type GaN-based crystal formed on the buffer layer containing the BP crystal; and an active region containing a zinc blende-type $Al_yIn_xGa_{1-y-x}N$ (y≥0, x>0) mother crystal formed on an $Al_yGa_{1-y}N$ crystal having a zinc blende-type structure that is formed on the n-type GaN-based crystal, and $Al_yIn_xGa_{1-y-x}N$ (y≥0, x>0) nanodots formed in the zinc blende-type $Al_yIn_xGa_{1-y-x}N$ (y≥0, x>0) mother crystal, the $Al_yIn_xGa_{1-y-x}N$ (y≥0, x>0) nanodots having an In concentration higher than that of the zinc blende-type $Al_yIn_xGa_{1-y-x}N$ (y≥0, x>0) mother crystal; wherein a tip of each of the $Al_yIn_xGa_{1-y-x}N$ (y≥0, x>0) nanodots is not buried in the zinc blende-type $Al_yIn_xGa_{1-y-x}N$ (y≥0, x>0) mother crystal.

The present invention provides a high luminance light emitting device including a crystal of a zinc blende-type structure, which is difficult to be grown, as a mother crystal and having a nanodot structure that has a high concentration of In atoms having a small bandgap.

DESCRIPTION OF EMBODIMENTS

Hereinafter, several examples in which the present invention is carried out will be described. The present invention is not limited to any of the following examples, and these examples may be modified in any of various manners to carry out the present invention. In this specification, an expression that an element is "on" another element may indicate that the first element is directly on the second element or that the first element is on the second element with a plurality of third elements being provided between the first element and the second element.

Example 1

Figure 1:
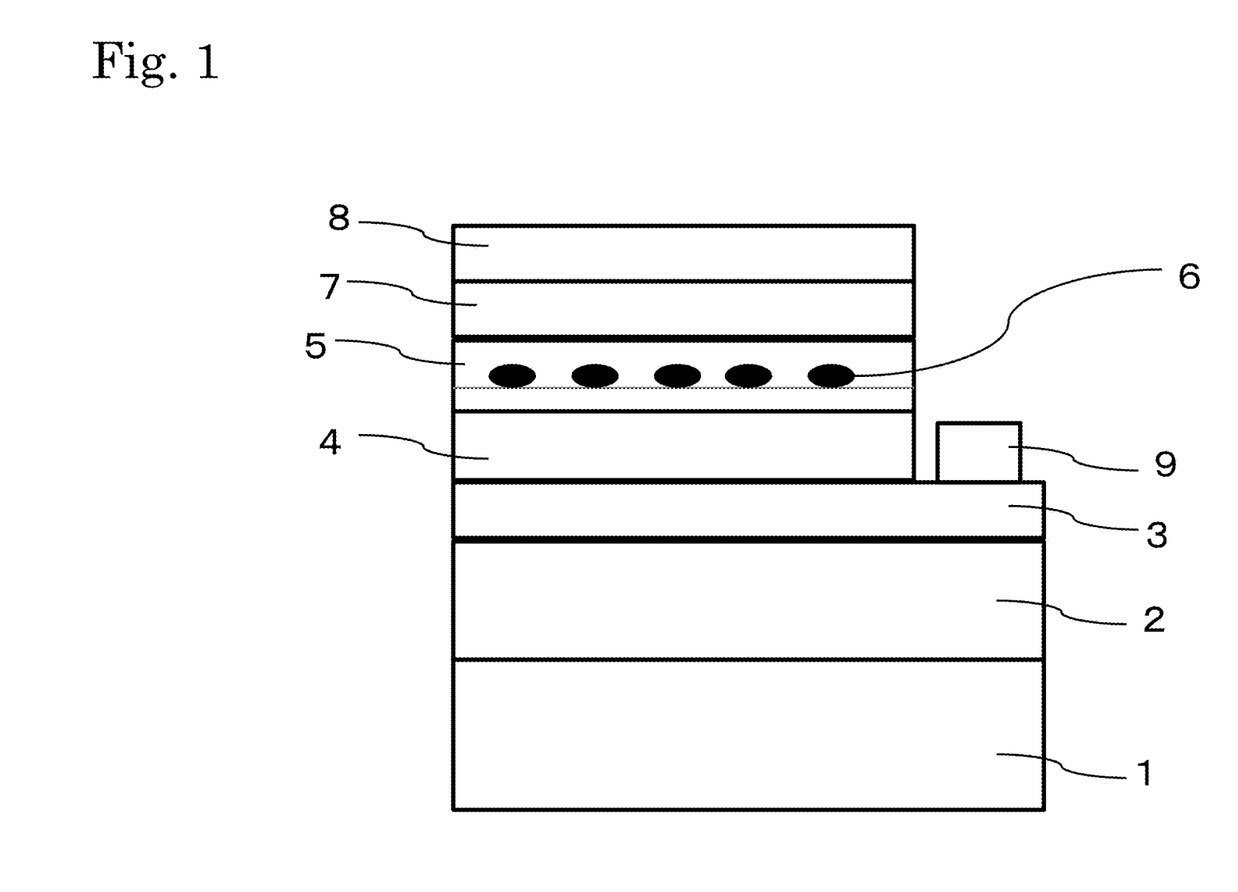
FIG. 1 is a schematic view showing a structure of a light emitting device in an example according to the present invention.

FIG. 1 is a schematic view of a structure of a light emitting device in an example according to the present invention. Reference sign 1 represents an Si substrate on which GaN-based semiconductor crystals are to be grown. As the substrate on which GaN-based semiconductor crystals are to be grown, any of various substrates may be used including a sapphire substrate, a silicon carbide substrate, a gallium nitride substrate, an aluminum nitride substrate and the like. In the case where an Si substrate is used as such a growth substrate, a composite device including a light emitting device and a semiconductor integrated circuit may be produced.

Reference sign 2 represents a buffer layer containing a BP crystal. In the case where the buffer layer is formed of a BP crystal, the GaN-based crystals formed thereon may be zinc blende-type crystals.

Reference sign 3 represents an Si-doped n-type GaN-based crystal. Since the buffer layer 3 is formed of the BP crystal, the n-type GaN-based crystal 3 is a zinc blende-type crystal. On the n-type GaN-based crystal 3, an n-type electrode (reference sign 9) is provided. Reference signs 4 and 7 each represent an $Al_yGa_{1-y}N$ crystal. The $Al_yGa_{1-y}N$ crystal is also a zinc blende-type crystal. The $Al_yGa_{1-y}N$ crystals 4 and 5 have an active region (described below) therebetween. The layers having the active region therebetween contain Al so as to have a bandgap sufficiently larger than that of the active region. It should be noted that the $Al_yGa_{1-y}N$ crystal 4 may be omitted for the following reason. A hole has a mobility lower than that of an electron. Therefore, absence of the $Al_yGa_{1-y}N$ crystal 4 having a role of a stopper for holes does not greatly influence the light emission efficiency.

Reference sign 5 represents zinc blende-type $Al_yIn_xGa_{1-y-x}N$ ($y \geq 0$, $x > 0$), which forms a mother crystal. Reference sign 6 represents nanodots of $Al_yIn_xGa_{1-y-x}N$ ($y \geq 0$, $x > 0$) (hereinafter, referred to simply as "In dots") formed in the mother crystal. The In dots 6 are formed on an underlying layer formed of the mother crystal 5, and a gap among the In dots 6 is also filled with the mother crystal 5. The In dots 6 form an active region according to the present invention. The In dots 6 have an In concentration higher than that of the $Al_yIn_xGa_zN$ ($y \geq 0$, $x > 0$) crystal, which is the mother crystal. The In dots 6 desirably have a diameter of 100 nm or shorter for the following reason. In the case where the diameter of the In dots 6 is 100 nm or shorter, the electric current may be efficiently concentrated. In order to provide an quantum effect, it is desirable that the In dots 6 have a diameter of 25 nm or shorter.

The In dots 6 desirably have a density of $10^3/cm^2$ or higher and $10^4/cm^2$ or lower. In the case where the density of the In dots 6 is controlled in this manner, an electric current density with which a high light emission efficiency is provided is realized.

The concentration of the In dots 6 is adjustable to control a wavelength of light to be emitted. For example, the value of x in $Al_yIn_xGa_{1-y-x}N$ ($y \geq 0$, $x > 0$) may be varied from 0.15 to 0.9, so that the wavelength is controlled to be 450 nm to 850 nm.

Reference sign 8 represents a p-type GaN-based crystal. In order to make the crystal p-type, Mg, for example, is incorporated into the GaN-based crystal. Although not shown, a p-type electrode is formed on the p-type GaN-based crystal 8 with, for example, an electric current diffusion layer being provided therebetween.

Now, a method for producing a light emitting device according to the present invention will be described.

All the crystals are grown by a MOCVD method. As a growth substrate, on which GaN-based crystals are to be grown, the Si substrate 1 is prepared. On a surface of the Si substrate 1, the BP crystal is epitaxially grown to form the buffer layer 2. The Si substrate is, more specifically, an n-type Si substrate doped with P (phosphorus). For the epitaxial growth of the BP crystal, for example, a mixture gas of $PCl_3$ gas (phosphorus trichloride) and $BCl_3$ (boron trichloride) is used as a material gas and $H_2$ is used as a carrier gas. Another example of gas used as the material gas may be a mixture gas of $PH_3$ (phosphine) and $B_2H_6$ (diborane).

In the case where the buffer layer is formed of the BP crystal, the GaN-based crystals formed thereon are all zinc blende-type crystals. The BP crystal has a thickness of desirably 100 nm or greater, and more desirably 150 nm or greater, in consideration that a crystal defect (dislocation) may be introduced. Although not shown in FIG. 1, it is desirable that an In film having a thickness of about 1 atom layer (about 0.5 nm) is stacked on the buffer layer formed of the BP crystal by use of $(CH_3)_3In$ (trimethylindium) gas and then to grow the GaN-based crystals. In the case where the In film having a thickness of about 1 atom layer (about 0.5 nm) is provided between the buffer layer formed of the BP crystal and the GaN-based crystals, the GaN-based crystals are superb zinc blende-type crystals. The In film having a thickness of about 1 atom layer (about 0.5 nm) stacked on the buffer layer formed of the BP crystal is thin and thus maintains the zinc blende-type crystal structure.

The In film having a thickness of about 1 atom layer (about 0.5 nm) is detected as an In spot when the GaN-based crystals are grown thereon.

In the case where the In film having a thickness of about 1 atom layer (about 0.5 nm) is stacked on the buffer layer formed of the BP crystal and then the GaN-based crystals are stacked thereon, the GaN-based crystals are superb zinc blende-type crystals having a low dislocation density. A reason for this has not been clarified. The lattice constant of a BP crystal is about 0.454 nm, and the lattice constant of a GaN-based crystal is about 0.451 nm. The lattice constant of an InGaN crystal is increased when the ratio of In is increased. Therefore, it is considered that the In film provided by the above-described growth method, in cooperation with the GaN-based films formed thereon, effectively solves the lattice constant mismatch as if there were an InGaN film having a relatively high In content.

Accordingly, even in the case where an InGaN film having a thickness of 1 to several atom layers (about 0.5 to 2 nm) and having a relatively high In content, or an InAl mixture film having a thickness of about 1 atom layer (about 0.5 nm) and having a relatively high In content, is provided instead of the In film having a thickness of about 1 atom layer (about 0.5 nm), substantially the same effect is provided.

For stacking an InGaN film having a thickness of 1 to several atom layers (about 0.5 to 2 nm) and having a relatively high In content, a mixture gas of $CH_3$—$NH$—$NH_2$ (monomethylhydrazine), $(CH_3)_3Ga$ (trimethylgallium) and $(CH_3)_3In$ (trimethylindium) is used. The InGaN film desirably has a thickness of 1 to several atom layers (about 0.5 to 2 nm). The InGaN film is thin and thus maintains the zinc blende-type crystal structure.

For stacking an InAl mixture film having a thickness of about 1 atom layer (about 0.5 nm) and having a relatively high In content, a mixture gas of $(CH_3)_3In$ (trimethylindium) and $(CH_3)_3Al$ (trimethylaluminum) is used. The InAl mixture film desirably has a thickness of 1 to several atom layers (about 0.5 to 2 nm). The InAl mixture film is thin and thus maintains the zinc blende-type crystal structure.

Alternatively, the layer provided between the buffer layer formed of the BP crystal and the GaN-based crystal may be a superlattice layer having a stacking structure of GaInN/GaN/GaInN/GaN/GaInN/GaN/GaInN/GaN/GaInN/GaN and a total thickness of 14 nm. This superlattice layer maintains the zinc blende-type structure. The superlattice layer is formed as follows. (1) An InGaN layer having a thickness of 1.4 nm is formed by use of a mixture gas of $CH_3$—$NH$—$NH_2$ (monomethylhydrazine), $(CH_3)_3Ga$ (trimethylgallium) and $(CH_3)_3In$ (trimethylindium); and (2) a GaN layer having a thickness of 1.4 nm is formed by use of a mixture gas of $CH_3$—$NH$—$NH_2$ (monomethylhydrazine) and $(CH_3)_3Ga$ (trimethylgallium). The steps of (1) and (2) are repeated four more times. Thus, the superlattice layer having a stacking structure of GaInN/GaN/GaInN/GaN/

GaInN/GaN/GaInN/GaN/GaInN/GaN and a total thickness of 14 nm, which maintains the zinc blende-type crystal structure is formed on the buffer layer formed of the BP crystal.

In the above embodiment, $CH_3$—NH—$NH_2$ (monomethylhydrazine) is used as a nitrogen source. Alternatively, DMHy (dimethylhydrazine) may be used.

On the BP crystal, the n-type GaN-base crystal 3 is formed. As a material gas for GaN, trimethylgallium (Ga($CH_3$)$_3$; TMG) and ammonia ($NH_3$), for example, are used. As an n-type impurity, Si is doped. The n-type GaN-based crystal 3 is a zinc blende-type crystal.

On the n-type GaN-based crystal 3, the $Al_yGa_{1-y}N$ crystal 4 is grown. As a material gas for the $Al_yGa_{1-y}N$ crystal 4, trimethylgallium (TMG), trimethylaluminum (TMA; ($CH_3$)$_3$ Al), cyclopentadienylmagnesium ($Cp_2Mg$) and ammonia ($NH_3$), for example, are used. As the carrier gas that transports the materials, $H_2$, for example, is used.

On the $Al_yGa_{1-y}N$ crystal 4, the $Al_yIn_xGa_{1-y-x}N$ (y≥0, x>0) mother crystal 5 and the In dots 6 having an In concentration higher than that of the mother crystal 5 are formed. The mother crystal 5 is a zinc blende-type crystal. The value of x in $Al_yIn_xGa_{1-y-x}N$ (y≥0, x>0) is adjustable in the range of 0.01 or greater and 0.9 or less. In the case where green light is to be emitted, it is desirable that the materials are supplied such that the value of x is 0.4. In the case where blue light is to be emitted, it is desirable that the materials are supplied such that the value of x is 0.3 or greater and 0.35 or less.

Now, a method for forming the In dots 6 will be described. The conclusion is that the present inventor has found by experiments that the In concentration, the dot diameter and the dot density of the In dots 6 are controllable by controlling the growth temperature, the supply amount of the material gas for In, and the pressure of the material gas.

The growth temperature for the $In_xGa_{1-x}N$ crystal is set to, for example, 700° C. The concentrations of the materials are set such that the In concentration x is 0.40. As a growth atmospheric gas, nitrogen gas is used. The In dots 6, in which the In concentration is high, are grown at a density of about $10^9/cm^2$ as In dot nuclei immediately after the growth is started. The In dots 6 have a diameter of 10 nm or longer and 50 nm or shorter. The density of $10^9/cm^2$ is too high as the density of the In dots 6. Therefore, after this, the substrate temperature is raised to 800° C. while the amount of the material gas for In is kept the same. In this state, a region in which the In content is excessively high (hereinafter, referred to as an "In-excessive region") and a region in which the In content is low (hereinafter, referred to as an "In-low region") are separated from each other more greatly. In addition, the In dots 6 are combined together, for example. The In dots 6 having a relatively long diameter are grown, and the In dots 6 having a relatively short diameter are absorbed to the In dots 6 having a relatively long diameter.

After this, the density of the In dots 6 becomes about $10^4/cm^2$. In the case where the density of the In dots 6 is $10^4/cm^2$, an electric current density with which a high light emission efficiency is provided is realized. Thus, an optically active region containing the In dots 6 is formed. In order to allow light of a desirable wavelength to be emitted, the In concentration of the In dots 6 may be controlled by changing the concentration of the atmospheric gas. Specifically, the supply amount of TMI gas (trimethylindium gas) or DMI gas (dimethylindium gas) is changed. A reason for this is that in nitrogen gas, there is a tendency that when the flow rate (partial pressure) of TMI (trimethylindium) gas is increased, the In concentration of the In dots is increased. Alternatively, hydrogen gas may be incorporated into nitrogen gas. When merely about 5% of hydrogen gas is incorporated into nitrogen gas, the In concentration of the crystal is decreased. A reason for this is that: the solubility of In atoms in hydrogen gas is high at a high substrate temperature (e.g., 700° C. or higher); and thus when hydrogen gas is incorporated into nitrogen gas under the condition that the substrate temperature is high (e.g., 700° C. or higher) while the temperature and the pressure are kept the same, the In concentration of the In dots 6 is decreased. The concentration of the atmospheric gas may be changed in this manner, so that the In concentration of the In dots 6 is decreased. The In concentration of the In dots 6 may be adjusted, so that the wavelength of light emitted from the high luminance LED is controlled to be 250 nm to 420 nm, which corresponds to ultraviolet light. The $In_xGa_{1-x}N$ mother crystal is grown while being kept as the zinc blende-type crystal regardless of the value of x.

In the case where the value of x in $In_xGa_{1-x}N$ is 0.2 or less, it is not easy to separate the In-low region and the In-excessive region from each other. In this case, after the $In_xGa_{1-x}N$ crystal is grown, a heat treatment of lowering the substrate temperature from about 800° C. to about 650° C. may be performed for about 15 minutes. As a result, the In-excessive region and the In-low region are separated from each other. Merely one cycle of the heat treatment of lowering the temperature provides an effect of separating the In-excessive region and the In-low region from each other. In the case where heat treatment of lowering the substrate temperature is performed while the crystal layer is being grown, substantially the same effect is provided. Namely, while $In_xGa_{1-x}N$ is being grown at 700° C., the substrate temperature is lowered to 650° C. or lower. Such a temperature drop causes the In-excessive region and the In-low region to be separated from each other, and thus the In-excessive region is grown.

In the case where it is attempted to grow the $In_xGa_{1-x}N$ crystal such that x is 0.2, the supply amount of TMI gas may be increased during the growth of the $In_xGa_{1-x}N$ crystal to adjust the composition such that the In-excessive region and the In-low region are separated from each other easily. For example, when a different amount of TMI gas is supplied for 10 minutes such that x is about 0.5, the In-excessive region and the In-low region are separated from each other.

As described above, the In concentration, the dot diameter and the dot density of the In dots 6 are controllable by performing the heat treatment of lowering the temperature while the growth is being performed, by performing the heat treatment of lowering the temperature after the growth is finished, or by changing the supply amount of the gas. The heat treatment of lowering the temperature while the growth is being performed and the treatment of changing the supply amount of the gas may be combined, or the heat treatment of lowering the temperature after the growth is finished and the treatment of changing the supply amount of the gas may be combined, to control the In concentration, the dot diameter and the dot density of the In dots 6.

Figure 2:
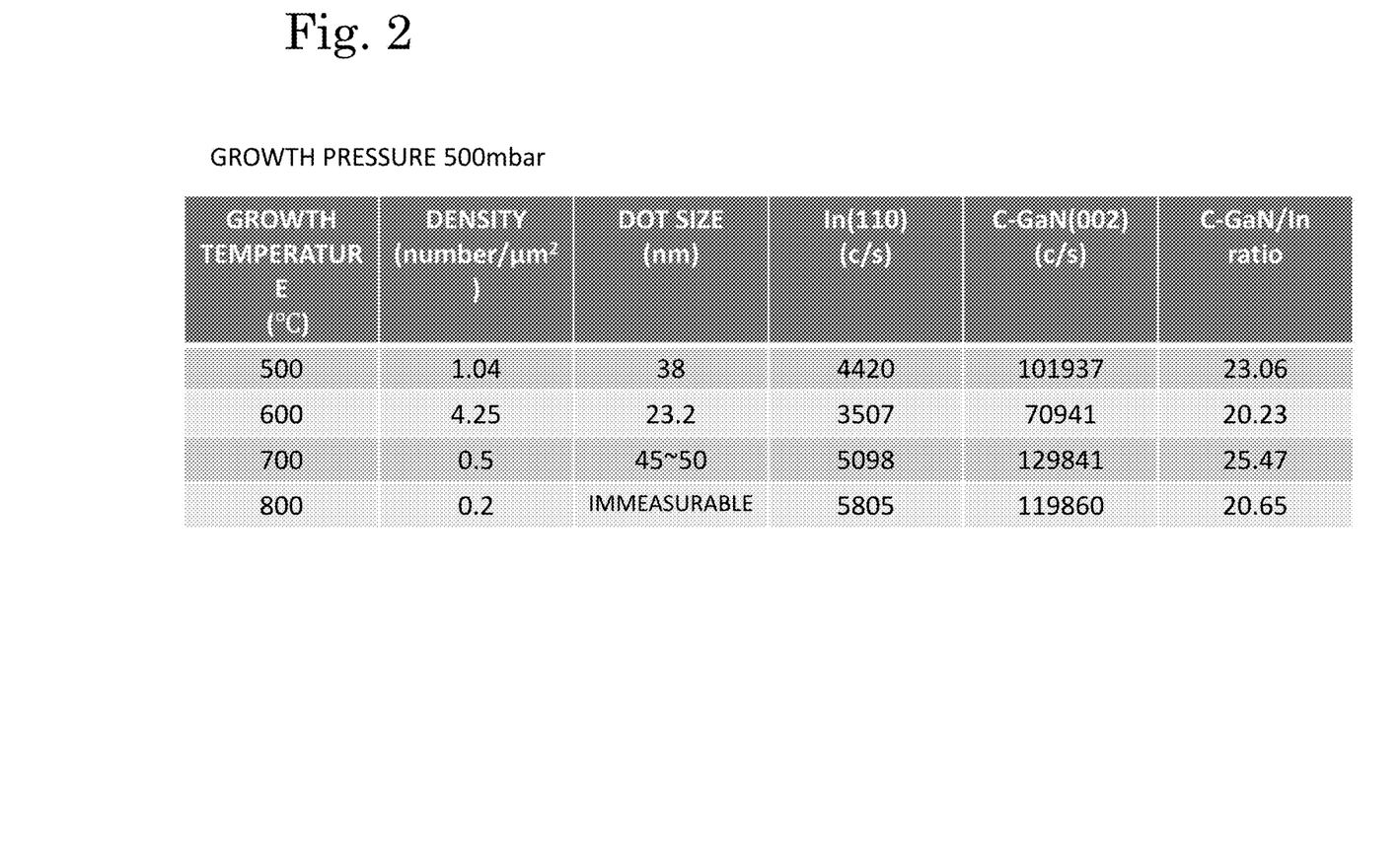
FIG. 2 is a table showing the dot diameter and the dot density of In dots 6 formed of $In_xGa_{1-x}N$ as a mother crystal, and the ratio between the In concentration and the GaN concentration of the IN dots 6, with respect to the growth temperature, when the growth pressure of gas is 500 mbar, the values in the table being derived from a plurality of experiments.
Figure 3:
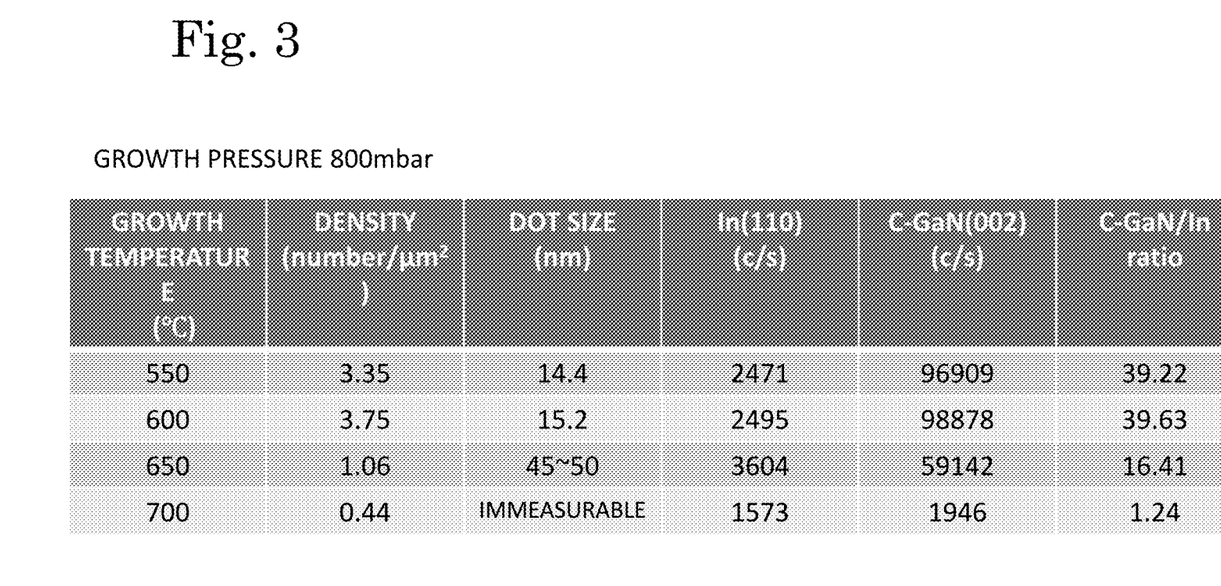
FIG. 3 is a table showing the dot diameter and the dot density of the In dots 6 formed of $In_xGa_{1-x}N$ as the mother crystal, and the ratio between the In concentration and the GaN concentration of the IN dots 6, with respect to the growth temperature, when the growth pressure of gas is 800 mbar, the values in the table being derived from a plurality of experiments.

Table 1 shown in FIG. 2 and Table 2 shown in FIG. 3 show the dot diameter and the dot density of the In dots 6 formed of $In_xGa_{1-x}N$ as the mother crystal, and the ratio between the In concentration and the GaN concentration of the IN dots 6, with respect to the growth temperature and the growth pressure of the gas. The values in the tables are derived from a plurality of experiments. Regarding these tables, the supply amount of the material gas is kept the same. The density of the In dots 6 is higher when the material gas pressure is 800 mbar than when the material gas pressure is 500 mbar. When the growth temperature is 550° C. or higher and 600° C. or lower, the In dots 6 are thread-like and easily extend upward. When the growth temperature is 650° C. or higher and 700° C. or lower, the In dots 6 are dot-like. When the growth temperature is 750° C. or higher, In is liquid or liquid-like, which is unstable in the shape, and thus the diameter of the In dots 6 is immeasurable.

Based on Table 1 in FIG. 2 and Table 2 in FIG. 3, it is understood that the density of the In dots 6 is higher when the material gas pressure is higher.

The In concentration, the dot diameter and the dot density of the In dots 6 formed of $Al_yIn_xGa_{1-y-x}N$, further containing Al, as the mother crystal are also controllable. In the case of the Al-containing In dots 6 formed of $Al_zAl_yIn_xGa_{1-y-x}N$ as the mother crystal, the crystal around the Al-containing In dots 6 acting as an active layer is an $Al_yIn_xGa_{1-y-x}N$ crystal having a large bandgap. This further increases the light emitting efficiency. Hereinafter, the control on the In concentration, the dot diameter and the dot density of the Al-containing In dots 6 formed of $Al_yIn_xGa_{1-y-x}N$ as the mother crystal will be described. The $Al_yIn_xGa_{1-y-x}N$ crystal according to the present invention is grown on the BP crystal and thus is a zinc blende-type crystal.

For growing the $Al_yIn_xGa_{1-y-x}N$ crystal, the material gas for Al is supplied such that the ratio thereof (y) in the crystal is about 0.3. The material gas for In is supplied such that the amount of In in the crystal, namely, the value of x, is less than 0.1. In the case where the growth is performed at a growth temperature of 770° C., the In dots 6 containing a certain amount of Al (hereinafter, referred to simply as the "In dots 6") are formed. The In dots 6 are grown at a density of about $10^6/cm^2$ as the In dot nuclei immediately after the growth is started. At this point, the diameter of the In dots 6 is 10 nm or longer and 20 nm or shorter. The density of $10^6/cm^2$ is too high as the density of the In dots 6.

Next, the substrate temperature is raised to 900° C. while the amounts of the material gas for Al and the material gas for In are kept the same. In this state, the In-excessive region and the In-low region are separated from each other more greatly. Namely, the In dots 6 are combined together. The In dots 6 having a relatively long diameter are grown, and the In dots 6 having a relatively short diameter are absorbed to the In dots 6 having a relatively long diameter. After this, the density of the In dots 6 becomes about $10^3/cm^2$. In the case where the density of the In dots 6 is about $10^3/cm^2$, an electric current density with which a high light emission efficiency is provided is realized. Thus, an optically active region containing the In dots 6 is formed.

In order to allow light of a desirable wavelength to be emitted, the In concentration of the In dots may be controlled by changing the atmospheric gas. For example, the supply amount of TMI gas may be changed. A reason for this is that in nitrogen gas, there is a tendency that when the flow rate (partial pressure) of TMI (trimethylindium) gas is increased, the In concentration of the In dots is increased. Alternatively, about 5% of hydrogen gas may be incorporated into nitrogen gas. In this case, the In concentration of the In dots 6 is decreased to about half. A reason for this is that: the solubility of In atoms in hydrogen gas is high at a relatively high substrate temperature of, for example, 700° C.; and thus when hydrogen gas is incorporated into nitrogen gas under the condition that the substrate temperature is high (e.g., 700° C. or higher) while the temperature and the pressure are kept the same, the In concentration of the In dots 6 is decreased.

In the case of the In dots 6 formed of $Al_yIn_xGa_{1-y-x}N$ as the mother crystal, the relationship of the dot diameter, the dot density, and the ratio between the In concentration and the GaN concentration, with the growth temperature and the growth pressure of the gas is substantially the same as the relationship in the case of the In dots 6 formed of $In_xGa_{1-x}N$ as the mother crystal. Therefore, in the case where the supply amount of each type of material gas is the same, the density of the In dots 6 formed of $Al_yIn_xGa_{1-y-x}N$ as the mother crystal is higher when the material gas pressure is 800 mbar than when the material gas pressure is 500 mbar. It should be noted that in the case of $Al_yIn_xGa_{1-y-x}N$, the growth temperature is higher by a level of about 100° C. or higher and 200° C. or lower than in the case of $In_xGa_{1-x}N$. Therefore, when the growth temperature is 650° C. or higher and 800° C. or lower, the In dots 6 are thread-like and easily extend upward. When the growth temperature is 750° C. or higher and 900° C. or lower, the In dots 6 are dot-like. When the growth temperature is 1000° C. or higher, In is liquid or liquid-like, which is unstable in the shape, and thus the diameter of the In dots 6 is immeasurable.

In the case of the In dots 6 formed of $Al_yIn_xGa_{1-y-x}N$ as the mother crystal also, the density of the In dots 6 is higher when the material gas pressure is higher.

As described above, the In concentration, the dot diameter and the dot density of the In dots 6 are controllable by the growth temperature, the supply amount of the material gas and the pressure of the material gas. A method for forming the In dots 6 more stably will be described below.

Modification Example 1

An Si substrate, on which GaN-based crystals are to be grown, is inclined at an angle in the range of 5 degrees or greater and 10 degrees or less from a (100) plane toward a (110) plane. The resultant crystal substrate is used for epitaxial growth. After a BP crystal is grown on the Si substrate, Si is doped to grow an n-type GaN-based crystal. The n-type GaN-based crystal is a zinc blende-type crystal. On a plane of the n-type GaN-based crystal, steps are grown at a substantially equal interval. The interval between the steps is related with the degree of inclination of the plane, the impurities doped and the like. For example, in the case where the concentration of the impurities exceeds $10^{18}/cm^{-3}$, the growth rate is decreased, and also the steps are made taller (several tens of atom layers) and the interval between the steps is widened because of a bunching effect. Desirably, the n-type GaN-based crystal may be doped with silicon at a concentration of $5\times10^{18}/cm^{-3}$ or higher and $5\times10^{20}/cm^{-3}$ or lower. In this example, the concentration of the impurity is $5\times10^{18}/cm^{-3}$. After the n-type GaN-based crystal is grown, the substrate temperature is lowered to 750° C. or lower, and a material gas is supplied to grow an $Al_yIn_xGa_{1-y-x}N$ crystal (y≥0, x>0).

Figure 4:
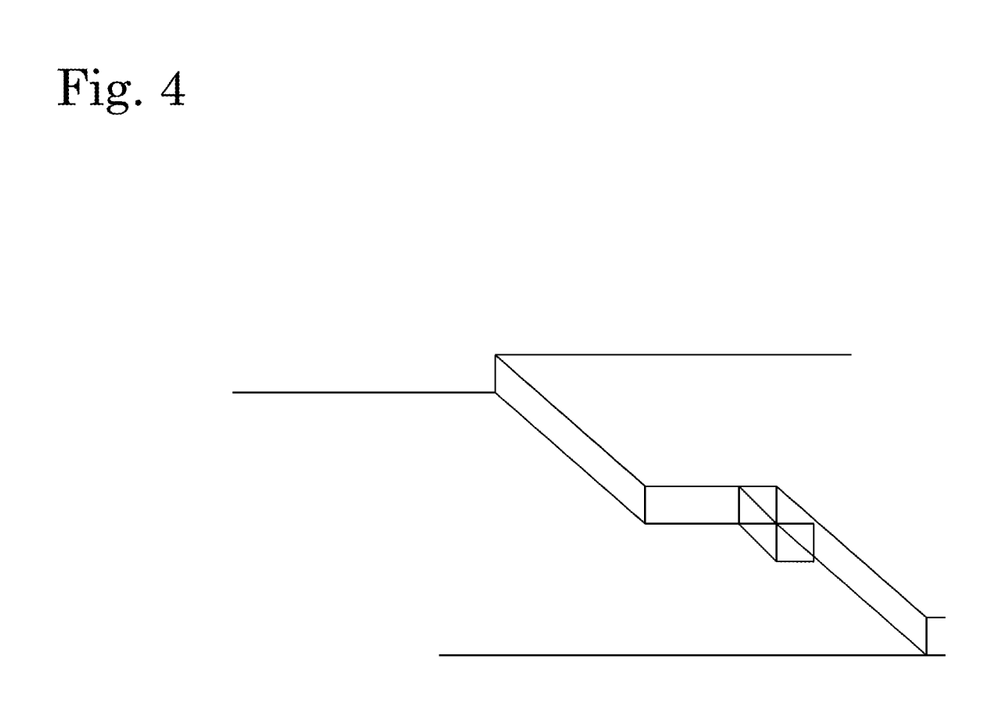
FIG. 4 shows the In dots grown on kinks of steps in the case where a growth substrate inclined in one direction is used.

The $Al_yIn_xGa_{1-y-x}N$ crystal (y≥0, x>0) grown by use of 100% of nitrogen gas as the atmospheric gas is non-uniformly grown with the value of x being about 0.15. Then, after the substrate temperature is raised to 850° C. or higher in the same atmosphere, In-containing particles are migrated on the crystal surface for about 10 minutes in a nitrogen atmosphere containing 3% of hydrogen gas. Then, as shown in FIG. 4, In-containing crystals gather to the steps that are away from each other by 5 to 8 μm, and thus a linear one-dimensional active layer is formed.

With this growth method, control on the growth rate and the growth temperature is important in order to accurately control the interval between the steps formed on the n-type GaN-based crystal that is first formed. In the case where the interval between the step is wide and the surface of the crystal is close to being flat, there is a tendency that when the growth temperature is raised on the stage of growing the $Al_yIn_xGa_{1-y-x}N$ crystal (y≥0, x>0), the In dots are grown with priority. By contrast, when the growth temperature is lowered, In is formed into quantum wires. Whether In is formed into the In dots or the quantum wires significantly depends on the growth rate. When the growth rate is high, In is formed into the quantum wires; whereas when the growth rate is low, In is formed into the In dots. In modification example 1, the In dots or the In quantum wires may be produced in accordance with the application by controlling the crystal growth temperature.

Modification Example 2

Figure 5:
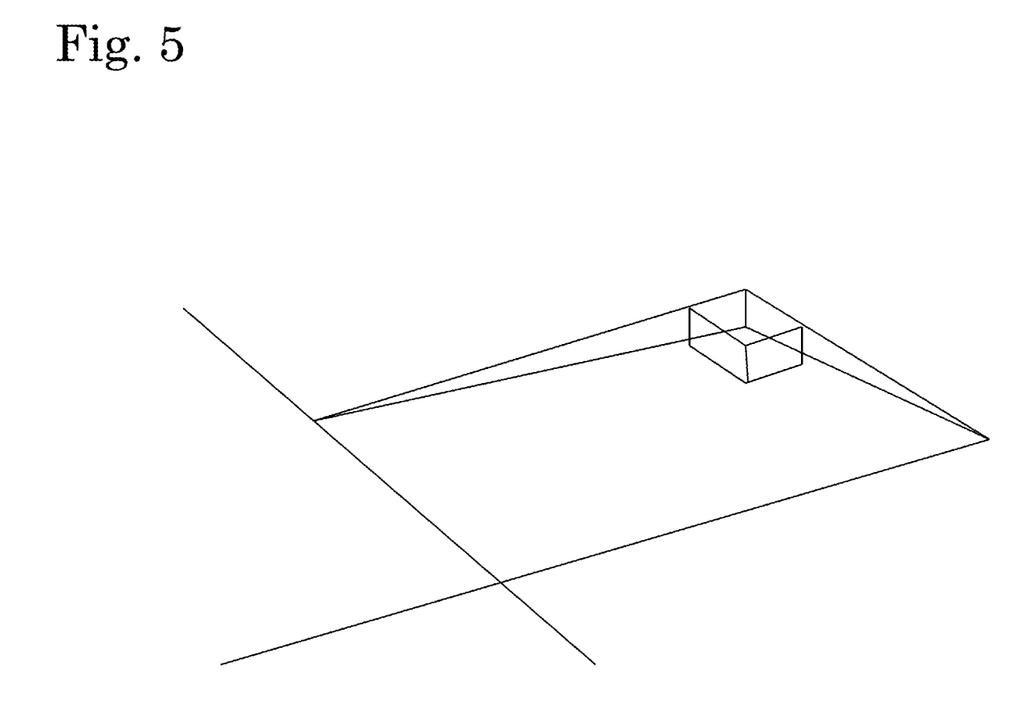
FIG. 5 shows that in the case where a growth substrate inclined in a plurality of directions is used, the In dots gather to an intersection of steps to form a dot-like zero-dimensional active region.

An Si substrate is inclined at an angle in the range of 5 degrees or greater and 10 degrees or less from a (100) plane toward a (110) plane, and at angle in the range of 5 degrees or greater and 10 degrees or less from the (100) plane toward a (111) plane. The resultant crystal substrate is used for epitaxial growth. After a BP crystal is grown on the Si substrate, Si is doped to grow an n-type GaN-based crystal. The n-type GaN-based crystal is a zinc blende-type crystal. On a plane of the n-type GaN-based crystal, steps are grown at a substantially equal interval. The interval between the steps is related with the degree of inclination of the plane, the impurities doped and the like. When the angle of inclination of the plane is increased, the interval between the steps is narrowed. When the concentration of the impurities doped is increased, the interval between the step is slightly widened and the steps are made taller (bunching effect). Regarding the impurities, desirably, the n-type GaN-based crystal may be doped with silicon at a concentration of $5 \times 10^{18}/cm^{-3}$ or higher and $5 \times 10^{20}/cm^{-3}$ or lower. In this example, the n-type GaN-based crystal is doped with silicon at a concentration of $5 \times 10^{18}/cm^{-3}$ as an n-type impurity. After the n-type GaN-based crystal is grown, the substrate temperature is lowered to 750° C. or lower, and a material gas for $Al_yIn_xGa_{1-y-x}N$ is supplied for about 1 minute to grow an $Al_yIn_xGa_{1-y-x}N$ crystal (x=0.15). As the atmospheric gas, 100% of nitrogen gas is used. Then, after the substrate temperature is raised to 850° C. or higher in the same atmosphere, In-containing particles are migrated on the surface of the $Al_yIn_xGa_{1-y-x}N$ crystal (x=0.15) for about 15 minutes in a mixture atmosphere of nitrogen gas and hydrogen gas containing 10% of hydrogen gas. Then, In-containing crystals, namely, In dots gather to intersections of the steps, and thus a dot-like zero-dimensional active region is formed. FIG. 5 shows this state.

Modification Example 3

Modification 3 is regarding a structure of the active region after the In dots 6 formed of $In_xGa_{1-x}N$ as the mother crystal are grown. The $In_xGa_zN$ (y≥0, x>0) mother crystal 5 is grown, and In dots 6 having an In concentration higher than that of the mother crystal 5 is grown on the mother crystal 5 (in a state where the gap among the In dots 6 is not filled with the mother crystal 5 of $In_xGa_zN$ (y≥0, x>0)). Then, the substrate temperature is lowered from 800° C. by a level of 100° C. or higher and 200° C. or lower, and the supply amount of the material gas for Ga is increased to about twice as large. As a result, amorphous-like $In_xGa_{1-x}N$ having an In concentration lower than that of the In dots 6 and incomplete crystallinity is grown to fill the gap among the In dots 6, and the gap among the In dots 6 is filled with the amorphous-like $In_xGa_{1-x}N$ having incomplete crystallinity. Thus, the surface is flattened. Namely, in this modification example, the gap among the In dots 6 is filled with the amorphous-like $In_xGa_{1-x}N$ having an In concentration lower than that of the In dots 6 and incomplete crystallinity, not with the mother crystal formed of $In_xGa_{1-x}N$.

The In dots 6 are buried in amorphous $In_xGa_{1-x}N$, which has a high electrical resistance, and therefore, holes and electrons gather to the In dots and recombination occurs with priority. Thus, light is emitted efficiently. The amorphous-like $In_xGa_{1-x}N$ having incomplete crystallinity has an In concentration lower than that of the In dots 6, and therefore, has a bandgap larger than that of the In dots. This also increases the light emission efficiency.

A certain type of light emitting device requires a reproducible crystal growth process. For example, a high luminance semiconductor laser, a multi-color semiconductor laser and the like require epitaxial process, chemical etching, processing step and the like to be repeated a plurality of times. In the case of such a product, more stable quantum dots need to be formed. Especially in order to withstand the heat treatment or the like, such a product requires quantum dots having a stable crystal structure.

Modification 4

Thus, a substrate inclining in a plurality of directions is used that is obtained by inclining an Si crystal substrate having a (100) plane at an angle in the range of 3 degrees or greater and 10 degrees or less toward a (110) plane, and at an angle in the range of 3 degrees or greater and 10 degrees or less toward a (111) plane. An Si crystal substrate inclining in two directions is used. On the substrate, a BP crystal is grown, and an n-type GaN-based crystal is epitaxially grown thereon. After the n-type GaN-based crystal is grown by about 1 µm, the substrate is removed from the growth furnace. For example, the substrate removed from the growth furnace is subjected to etching at about 150° C. for about 10 minutes by use of a potassium hydroxide (KOH) solution. Then, the substrate is washed so that the potassium element does not remain on the substrate. An observation of the surface of the substrate with a microscope on this stage finds that (100) planes are generated at an interval of about 100 nm in four directions while being surrounded by the inclining steps. This is a structure obtained by increasing the depth of the steps shown in FIG. 5.

Then, the substrate is set in an epitaxial growth furnace, and an $In_{0.25}Ga_{0.75}N$ crystal is grown in an atmospheric gas, which is nitrogen gas or nitrogen gas containing hydrogen at a content of 1% or higher and 5% or lower. The growth temperature is in the range of 300° C. or higher and 550° C. or lower, such that the difference in the growth rate in accordance with the direction of the plane is conspicuously expressed. For example, the growth temperature is set to 500° C. on an initial stage; and then after the $In_{0.25}Ga_{0.75}N$ crystal as the mother crystal is grown to have a thickness of 10 atom layers or greater and 70 atom layers or less, for example, a thickness of 30 nm or greater and 100 nm or less, the substrate temperature is set to 400° C. and a heat treatment is performed for about 10 minutes such that the In dots 6 gather to the intersections of kinks.

As a result of such a heat treatment performed for 10 minutes, In dots having an In concentration higher than that of the $In_{0.25}Ga_{0.75}N$ crystal as the mother crystal are grown at the intersections of the kinks on the surface of the $In_{0.25}Ga_{0.75}N$ crystal as the mother crystal. The In dots 6 are grown as zinc blende-type In dots 6, like the mother crystal. In this case, the maximum diameter of the In dots 6 is about 20 nm. Thus, the active region is formed.

In this example, the etching is performed at 150° C. for about 10 minutes by use of a potassium hydroxide (KOH) solution. It is desirable that before the etching is performed, the positions at which the In dots 6 are to be formed are irradiated with laser light in advance so as to increase the etching rate. A reason for this is that in this manner, the inclining steps are made deeper, and the In dots 6 are easily grown at positions surrounded by the inclining steps.

In the case where the etching performed by use of potassium hydroxide (KOH) or high-temperature oxoacid ($HPO_3$) does not easily cause intersections of the kinks to appear on the (100) plane, the following may be performed. After the n-type GaN-based crystal is grown, an $SiN_3$ crystal film is deposited to a thickness of about 20 nm on the surface of the n-type GaN-based crystal regardless of the angle of inclination of the surface of the growth substrate, and holes are formed at an space having a diameter of, for example, 30 nm or longer and 100 nm or shorter by plasma etching or the like. Thus, the quantum dots are easily grown.

Modification Example 5

A method for producing Ga-excessive dots formed of $Al_yGa_{1-y}N$ crystal as the mother crystal (hereinafter, referred to as "Ga dots") will be described. The $Al_yGa_{1-y}N$ crystal has a zinc blende-type structure; and when the value of y is less than 0.8, the $Al_yGa_{1-y}N$ crystal has properties of a direct transition crystal.

A material gas for $Al_yGa_{1-y}N$ is supplied such that the content of Al and the content of Ga in $Al_yGa_{1-y}N$ are each 0.5. The growth temperature is, for example, 900° C. Next, the substrate temperature is raised to, for example, 1000° C. As a result, a crystal starts growing while an Al-excessive region and a Ga-excessive region are separated from each other. The Ga dots are grown at a density of about $10^8/cm^2$ as Ga dot nuclei immediately after the growth is started. At this point, the diameter of the Ga dots is 50 nm or longer and 100 nm or shorter. Such a density of the Ga dots is too high. Therefore, after this, the substrate temperature is raised to 1100° C. while the amount of the material gas for Ga is kept the same. In this state, the Ga-excessive region and the Al-low region are separated from each other more greatly. The Ga dots start to be combined together. The Ga dots having a relatively long diameter are grown, and the Ga dots having a relatively short diameter are absorbed to the Ga dots having a relatively long diameter. After this, the density of the Ga dots becomes about $10^3/cm^2$. In the case where the density of the Ga dots is $10^3/cm^2$, an electric current density with which a high light emission efficiency is provided is realized. Thus, an optically active region containing the Ga dots is formed.

In order to allow light of a desirable wavelength to be emitted, the Ga concentration of the Ga dots may be controlled. The Ga concentration may be controlled by changing the atmospheric gas. For example, the supply amount of Ga gas may be increased. For example, the supply amount of Ga gas may be increased from 70000 cc/s to 100000 cc/s to increase the Ga concentration of the Ga dots. Alternatively, in order to make the bandgap of the Ga dots smaller than that of the $Al_yGa_{1-y}N$ crystal as the mother crystal, the material gas for In may also be supplied while the Ga dots are being grown, so that the Ga dots containing In at a content higher than that of the $Al_yGa_{1-y}N$ crystal as the mother crystal is grown. The Ga concentration of the Ga dots may be controlled in the range of 0.4 or greater and 0.9 or less, so that the wavelength of light emitted from the light emitting device is 200 nm, 300 nm or 350 nm.

(Semiconductor Laser)

In the case where the In dots 6 according to the present invention are used for an active region of a semiconductor laser, it is desirable that the In dots 6 are formed to have a periodicity. Therefore, it is desirable that as described in modification examples 1 through 4, an inclined plane is provided at the surface of the substrate, and the In dots 6 are formed by use of steps, kinks of the like formed at a substantially equal interval on the surface of the GaN-based crystal grown on the inclined plane.

It is desirable that a tip of each of the In dots 6 is not buried in the $Al_yIn_xGa_{1-y-x}N$ crystal (y≥0, x>0) as the mother crystal and remains on the mother crystal. Then, p-type GaN doped with Mg is grown, and then another $Al_xGa_{1-x}N$ layer having a different concentration of Al is grown. In this manner, two or more types of $Al_xGa_{1-x}N$ layers may be grown. Such a structure allows a semiconductor laser consuming little power to be produced. The structure, by which the tip of each of the In dots 6 in the $Al_yIn_xGa_{1-y-x}N$ crystal as the mother crystal is not buried and remains on the mother crystal and then p-type GaN doped with Mg gather is grown, is also applicable to an LED. An LED having such a structure emits light when being supplied with a low voltage and has an advantage of consuming little power.

(Structure Promoting the Carrier Recombination)

Regarding the light emitting device including an active region formed of In dots or Ga dots described so far, a structure promoting the carrier recombination will be described, hereinafter. For example, an Si substrate that is inclined at 8 degrees from a (100) plane toward a (110) plane is set as a growth substrate. On the Si substrate, an n-type BP crystal doped with the Si element is grown. The BP crystal is grown to have a thickness of 200 nm or greater in consideration that a crystal defect (dislocation) may be introduced. Even in a state where the BP crystal is grown to a thickness of about 300 nm, the angle of inclination of the substrate is kept substantially the same. After this, a mixture gas of TMA (trimethylaluminum) and TMI (trimethylindium) is supplied to the substrate in a nitrogen atmosphere at a substrate temperature of 470° C. to deposit a mixture metal layer of Al and In to a thickness of 1 atom layer or greater and 15 atom layers or less on the BP crystal. The mixture metal layer of Al and In is desirably deposited to a thickness of 2 atom layers or greater and 5 atom layers or less. In the case where In or Al is deposited on the entirety of the surface to a thickness of 2 atom layers or greater and 5 atom layers or less, the layers to be stacked thereafter are grown successfully.

The ratio between Al and In in the mixture metal layer of Al and In is that Al:In=80%:20%. In this case also, the Si element may be doped as an impurity. After this, an n-type GaN-based crystal is grown at about 600° C. At this point, an $Al_yIn_xGa_{1-y-x}N$ crystal having a high Al concentration and having a bandgap larger than that of the GaN-based crystal is grown just above the BP crystal. This structure results in being capable of promoting the carrier recombination in the active region at the time of production of an optical device.

In the above description of the present invention, the active region is formed of a single layer. Alternatively, the active region may be formed of a plurality of layers, instead of a single layer. Needless to say, the claims of the present invention are applicable to the formation of such an active layer.

As the growth substrate, an Si substrate has mainly been described. Alternatively, a crystal substrate other than the Si substrate, such as an SiC crystal substrate, a GaAs crystal substrate, a sapphire crystal substrate or the like is usable. Even in the case where a sapphire substrate or the like is used, a sufficient effect by inclining the substrate is expected to be provided.

So far, an optical device has been described. The active region containing the quantum dots according to the present invention is applicable to a field effect transistor, a pnp-type or npn-type transistor, an integrated device including the same or the like, needless to say. Especially, the structure and the features of the present invention are useful for a combination of an electronic device and an optical device.

The invention claimed is:

1. A light emitting device, comprising:
   an Si substrate;
   a buffer layer formed on the Si substrate, the buffer layer containing a BP crystal which contains boron and phosphide;
   an n-type GaN-based crystal formed on the buffer layer containing the BP crystal; and
   an active region containing a zinc blende-type $Al_{y1}In_{x1}Ga_{1-y1-x1}N$ ($y_1 \geq 0$, $x_1 > 0$) mother crystal formed on the n-type GaN-based crystal, and $Al_{y2}In_{x2}Ga_{1-y2-x2}N$ ($y_2 \geq 0$, $x_2 > 0$) nanodots formed in the zinc blende-type $Al_{y1}In_{x1}Ga_{1-y1-x1}N$ ($y_1 \geq 0$, $x_1 > 0$) mother crystal, the $Al_{y2}In_{x2}Ga_{1-y2-x2}N$ ($y_2 \geq 0$, $x_2 > 0$) nanodots having an In concentration higher than that of the zinc blende-type $Al_{y1}In_{x1}Ga_{1-y1-x1}N$ ($y_1 \geq 0$, $x_1 > 0$) mother crystal;
   wherein the Si substrate is a crystal substrate obtained as a result of being inclined at an angle in the range of 5 degrees or greater and 10 degrees or less from a (100) plane toward a (110) plane.

2. The light emitting device according to claim 1, wherein the n-type GaN-based crystal contains silicon incorporated thereto as an impurity.

3. The light emitting device according to claim 2, wherein the silicon is contained in the n-type GaN-based crystal at a concentration of $5 \times 10^{18}/cm^{-3}$ or higher and $5 \times 10^{20}/cm^{-3}$ or lower.

4. The light emitting device according to claim 1, wherein the Si substrate is a crystal substrate obtained as a result of being inclined at an angle in the range of 5 degrees or greater and 10 degrees or less from a (100) plane toward a (110) plane and being inclined at an angle in the range of 5 degrees or greater and 10 degrees or less from the (100) plane toward a (111) plane.

5. The light emitting device according to claim 4, wherein the n-type GaN-based crystal contains silicon incorporated thereto as an impurity.

6. The light emitting device according to claim 5, wherein the silicon is contained in the n-type GaN-based crystal at a concentration of $5 \times 10^{18}/cm^{-3}$ or higher and $5 \times 10^{20}/Cm^{-3}$ or lower.

7. A light emitting device, comprising:
   an Si substrate;
   a buffer layer formed on the Si substrate, the buffer layer containing a BP crystal which contains boron and phosphide;
   an n-type GaN-based crystal formed on the buffer layer containing the BP crystal;
   an $Al_yGa_{1-y}N$ crystal having a zinc blende-type structure formed on the n-type GaN-based crystal; and
   an active region containing a zinc blende-type $Al_{y1}In_{x1}Ga_{1-y1-x1}N$ ($y_1 \geq 0$, $x_1 > 0$) mother crystal formed on the $Al_yGa_{1-y}N$ crystal having a zinc blende-type structure, and $Al_{y2}In_{x2}Ga_{1-y2-x2}N$ ($y_2 \geq 0$, $x_2 > 0$) nanodots formed in the zinc blende-type $Al_{y1}In_{x1}Ga_{1-y1-x1}N$ ($y_1 \geq 0$, $x_1 > 0$) mother crystal, the $Al_{y2}In_{x2}Ga_{1-y2-x2}N$ ($y_2 \geq 0$, $x_2 > 0$) nanodots having an In concentration higher than that of the zinc blende-type $Al_{y1}In_{x1}Ga_{1-y1-x1}N$ ($y_1 \geq 0$, $x_1 > 0$) mother crystal;
   wherein the active region has a surface flattened by amorphous-like $In_{x3}Ga_{1-x3}N$ having incomplete crystallinity formed in a gap among the $Al_{y2}In_{x2}Ga_{1-y2-x2}N$ ($y_2 \geq 0$, $x_2 > 0$) nanodots so as to fill the gap.

8. The light emitting device according to claim 7, wherein the amorphous-like $In_{x3}Ga_{1-x3}N$ having incomplete crystallinity has an In concentration lower than that of the $Al_{y2}In_{x2}Ga_{1-y2-x2}N$ ($y_2 \geq 0$, $x_2 > 0$) nanodots.

9. A semiconductor laser, comprising:
   an Si substrate;
   a buffer layer formed on the Si substrate, the buffer layer containing a BP crystal which contains boron and phosphide;
   an n-type GaN-based crystal formed on the buffer layer containing the BP crystal;
   an $Al_yGa_{1-y}N$ crystal having a zinc blende-type structure formed on the n-type GaN-based crystal; and
   an active region containing a zinc blende-type $Al_{y1}In_{x1}Ga_{1-y1-x1}N$ ($y_1 \geq 0$, $x_1 > 0$) mother crystal formed on the $Al_yGa_{1-y}N$ crystal having a zinc blende-type structure, and $Al_{y2}In_{x2}Ga_{1-y2-x2}N$ ($y_2 \geq 0$, $x_2 > 0$) nanodots formed in the zinc blende-type $Al_{y1}In_{x1}Ga_{1-y1-x1}N$ ($y_1 \geq 0$, $x_1 > 0$) mother crystal, the $Al_{y2}In_{x2}Ga_{1-y2-x2}N$ ($y_2 \geq 0$, $x_2 > 0$) nanodots having an In concentration higher than that of the zinc blende-type $Al_{y1}In_{x1}Ga_{1-y1-x1}N$ ($y_1 \geq 0$, $x_1 > 0$) mother crystal;
   wherein a tip of each of the $Al_{y2}In_{x2}Ga_{1-y2-x2}N$ ($y_2 \geq 0$, $x_2 > 0$) nanodots is not buried in the zinc blende-type $Al_{y1}In_{x1}Ga_{1-y1-x1}N$ ($y_1 \geq 0$, $x_1 > 0$) mother crystal.

* * * * *